United States Patent [19]
Cimino et al.

[11] Patent Number: 4,700,122
[45] Date of Patent: Oct. 13, 1987

[54] POWER SUPPLY FILTERING WITH RECHARGEABLE BATTERY ELEMENT

[75] Inventors: Michael B. Cimino, Green River, Wyo.; Gregory M. Gearing, Dayton, Ohio

[73] Assignee: The United States of America as represented by the Secretary of the Air Force, Washington, D.C.

[21] Appl. No.: 792,098

[22] Filed: Oct. 28, 1985

[51] Int. Cl.$^4$ .......................... H02J 7/00; H01M 2/24
[52] U.S. Cl. ........................................ 320/61; 307/48; 307/46; 323/906; 429/153
[58] Field of Search .......................... 320/2–5, 320/61, 14; 323/906; 363/45; 307/46, 48

[56] References Cited

U.S. PATENT DOCUMENTS

| | | | |
|---|---|---|---|
| 3,257,603 | 6/1966 | Laube | 363/45 |
| 3,683,258 | 8/1972 | Harbonn | 320/21 X |
| 4,154,908 | 5/1979 | Menard | 429/206 |
| 4,204,147 | 5/1980 | Larrabee | 323/906 X |
| 4,215,184 | 7/1980 | Gutmann et al. | 429/101 |
| 4,287,465 | 9/1981 | Godard et al. | 307/46 X |
| 4,439,465 | 3/1984 | Reid et al. | 429/115 |
| 4,471,038 | 9/1984 | Vyas | 429/198 |
| 4,575,679 | 3/1986 | Chung et al. | 323/906 X |
| 4,650,733 | 3/1987 | Cimino et al. | 429/153 X |

*Primary Examiner*—R. J. Hickey
*Attorney, Agent, or Firm*—Gerald B. Hollins; Donald J. Singer

[57] ABSTRACT

A combined electrical filter and interrupted energy source for a space satellite or other DC powered apparatus. The disclosed filter battery preferably employs an array of nickel-cadmium cells each having circular configured electrodes parallelly disposed along an axis and interconnected by axially aligned inter-call conductors which attach to central areas of the electrodes. The resulting filter battery is electrically comprised of an array of selected value electrical elements disposed in a parallel-series configured network and related to elements of the battery cell structures. Filtering accomplished with the filter battery achieves high electrical energy per pound storage density, low electrical impedance, long charge/discharge cycle life, large current delivering ability and more constant voltage output in comparison with conventional electrolytic capacitor filter elements and other cell configurations.

20 Claims, 4 Drawing Figures

POWER SUPPLY FILTERING WITH RECHARGEABLE BATTERY ELEMENT

RIGHTS OF THE GOVERNMENT

The invention described herein may be manufactured and used by or for the Government of the United States for all governmental purposes without the payment of any royalty.

CROSS-REFERENCE TO RELATES APPLICATION

This invention is relates to the subject matter of a U.S. Air Force assigned patent application filed of even date herewith, titled "Low Impedance Filter Battery with Effective Electrolyte Seal" and identified as docket number AF 16775, and by U.S. Patent and Trademark Office (PTO) Ser. No. 06/792,099 now U.S. Pat. No. 4,650,733.

BACKGROUND OF THE INVENTION

This invention relates to the field of electric wave filters usable in power supply apparatus having a combination of pulsating load currents and limited supply currents. The described invention is particularly useful in satellite and other weight and volume limited environments.

Electrical energy storage in capacitor elements such as the common electrolytic capacitor frequency achieves an energy storage density in the order of 1 joule per pound of capacitor weight. For many presently feasible space shuttle and military space missions, this storage density in an electrical filter element provides a severe limitation as to the type of space mission that can be undertaken.

By way of example, the first man-made satellite, the Russian Sputnik launched in the late 1950's, employed a modest battery-powered electrical system which was capable of operating the satellite for a few weeks of time, but which nevertheless accounted for over one third of the satellite's overall weight. In the intervening twenty-five-plus years, launchable payloads have increased significantly in size, and improved space energy sources have become available. Even with present technology, however, the use of satellite systems having power supplies in range of 50 kilowatts (KW) is limited to low earth orbit because of the inability to transport systems of this electrical size and weight into higher orbit. A significant improvement in power supply weight will therefore contribute noticeable to the ability to place systems of this power level in higher orbit and enable the achievement of proposed systems having electrical capabilities in excess of 100 kw.

Electrical filtering is a necessary component in these larger power supplies as well as in power supplies of more modest capability. Electrical filters including energy storage capacitor elements are necessary, for example, in power supply waveform correcting, energy storage between pulses from an energy source, energy storage or buildup between high energy dumping events as might occur in a pulsed laser weapon, for example, and possibly for energy storage during the non-illuminated portion of a dark/light solar exposure cycle.

Under certain conditions as described subsequently herein, it is feasible to provide up to a tenfold increase in power supply energy filter storage density over the values described above using a different approach from that of the common electrolyte capacitor. In some proposed high-energy satellite applications, energy storage improvements of this capability would, for example, provide a satellite weight savings in the range of two to three tons of system payload. A central portion of this improvement resides in an optimized application of a rechargeable or secondary battery such as the nickel cadmium battery as an energy storing electrical filter element. In addition to the indicated considerations of energy storage density, such factors as battery service life, the imposed depth of discharge and the physical properties of battery filter cells require attention in embodying an electrical filter having these improved characteristics.

The patent art discloses several examples of battery cells usable for meeting a variety of battery requirements and their manufacture. Included in this art is the patent of Brijesh Vyas, U.S. Pat. No. 4,471,038, which concerns an alkaline battery cell, preferably a nickel-cadmium cell, which is improved through the addition of organic polymer compounds to one of the cell electrodes.

The patent art of interest also includes the patent of Margaret A. Reid, U.S. Pat. No. 4,439,465, which concerns a method for making a lightweight battery substrate or plaque that is also usable in a fuel cell.

The patent of Claude J. Menard, U.S. Pat. No. 4,154,908, concerns a electrode configuration for alkaline batteries wherein shapes enabling the use of unequal electrode material amounts on electrodes of different polarity are used—in order to obtain an improved life cycle and superior volumetric energy density. The Menard patent principally concerns silver-zinc, silver-cadmium, and nickel-zinc batteries. The Menard patent also teaches the use of potassium hydroxide as an electrolyte, and is concerned with increasing the number of discharge cycles and the depth of discharge characteristics of a battery. The Menard patent is especially concerned with electrode shape change or the migration of active material between different regions of an electrode.

The patent of Gunter Gutmann, U.S. Pat. No. 4,215,184 concerns an improved arrangement for nickel-oxide/hydrogen battery cells which achieves improved heat transfer in the axial direction of the cell through a reduction of the number of stacked elements in a cell.

The patent of David H. Fritts et al, U.S. Pat. No. 4,242,179, concerns a method for fabricating cadmium electrodes usable in nickel-cadmium and silver-cadmium batteries, for example. The Fritts patent achieves an improved loading of the cadmium material without surface buildup and also eliminates some of the electrode processing steps previously required.

SUMMARY OF THE INVENTION

An object of the present invention is to provide a lightweight, small-size, energy storing filter network element.

Another object of the invention is to provide a filter network element having better stored energy versus voltage characteristics than are afforded by the conventional electrolytic filter capacitor.

Another object of the invention is to provide an energy storage arrangement suitable for use in space satellites and other volume limited, weight limited applications.

Another object of the invention is to provide an electrical filter network element capable of storing energy for varying amounts of time between the asynchronized high current pulses supplying and utilizing the energy.

Another object of the invention is to provide an electrical filter network arrangement capable of the improved supplying of energy to a load during brief periods of source interruption.

Another object of the invention is to provide an electrical filter network arrangement capable of high density lightweight energy storage in combination with an extended life number of energy receiving, and energy dumping cycles.

Additional objects and features of the invention will be understood from the following description and the accompanying drawings.

These and other objects of the invention are achieved by an energy utilizing apparatus which includes a source of direct current energy pulses, an electrical load of pulsating electrical current requirements connected with the energy source, a rechargeable electrochemical battery of low internal impedance with respect to the source of energy and connected in electrical shunt with the source and the pulsating current load for collecting energy from the source and delivering energy to the load to supplement the supply during periods of load demand, the collecting and delivering being at a fixed predetermined battery terminal voltage and in pulses and pulsations having energy content less than one one-hundredth of the total energy capacity of the battery.

DETAILED DESCRIPTION

Earth satellites have become accepted tools for use in the communications art and are becoming increasingly important for use as weapons platforms, sites for manufacturing, scientific inquiry and other proposed uses. Since most of these uses of a satellite vehicle require the availability of electrical energy in significant quantities, and since the deployment of such satellites involves the use of limited capability and expensive rocket devices, improvements in the electrical energy supply apparatus used in such satellites are of intense technical and military interest.

Figure 1:
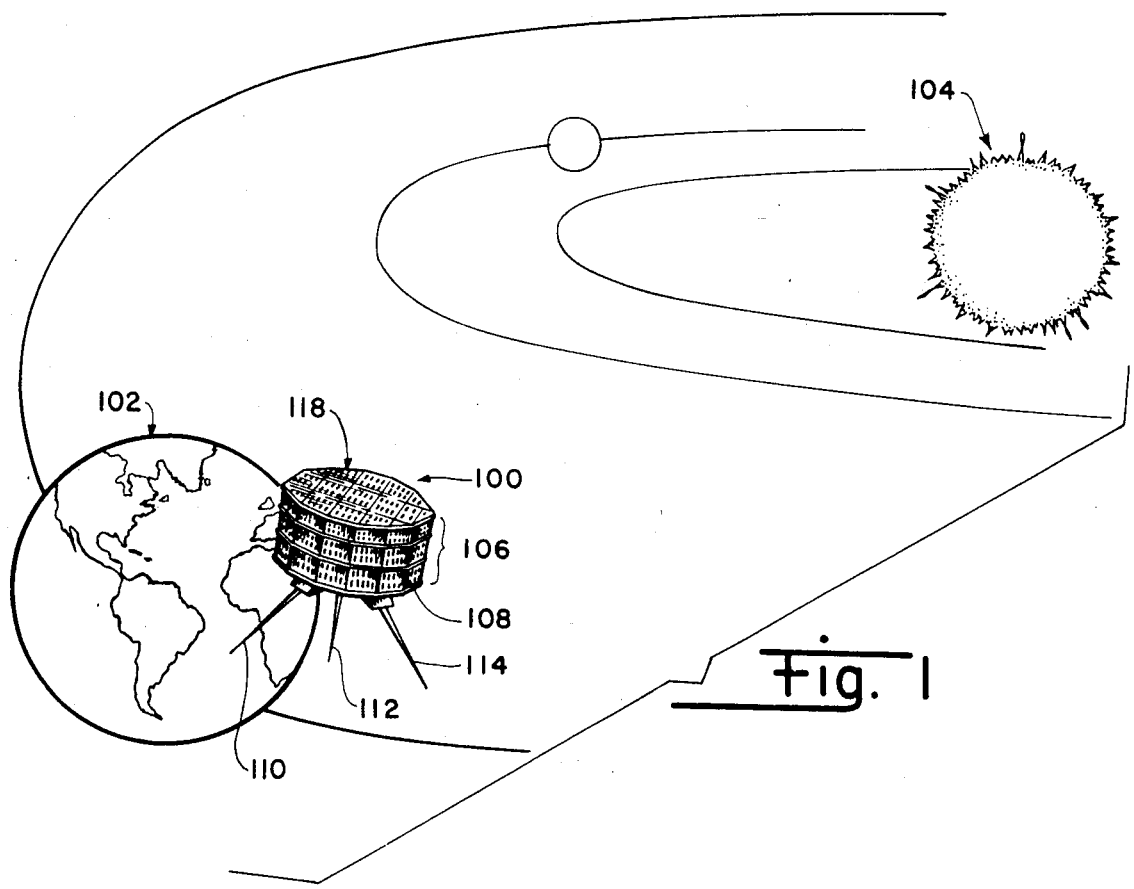
FIG. 1 shows an earth satellite arrangement of a type desirably utilizing the present invention.

FIG. 1 shows an earth satellite of the described type as it might appear to an observer located in space. In FIG. 1 the earth's sun is indicated at 104, the earth at 102, and an earth orbit residing satellite vehicle at 100. The satellite 100 in FIG. 1 is intended to contain one or more systems such as optical energy emitters or radio frequency energy emitters connected to a plurality of energy radiating devices or antennas 110, 112 and 114. The satellite 100 is presumed to be of the extended energy type and to therefore utilize internally sourced energy or to collect energy in the form of solar radiation on an array of solar cell panels which are disposed over the satellite surface, as indicated at 106. Solar collectors may also be disposed over the end surfaces of the satellite as indicated at 118, where the orbit and orientation patterns of the satellite 100 with respect tot he sun 104 are appropriate.

Electronic apparatus included in the satellite vehicle 100 may typically include a radio frequency or radar transmitter, a computer, mechanically actuated devices, and other apparatus having pulsating load current requirements. The current pulsations of such load systems frequently temporarily exceed the current delivering ability of the available energy source, such as the solar panel array. The energy delivered by the array of solar cell panels 106, 108, and 118 can also be subject to pulses or fluctuations as the satellite vehicle moves in orientation, moves around the earth and around the sun; such energy pulses can also result from shadows cast on the array of solar panels by other space objects such as the earth's moon or an intervening planet or from changes in orientation of the solar cell panel arrays with respect to the sun. In such events, some energy storage arrangement is desirable in order that the satellite vehicle load be capable of independent function in response to conditions other than energy availability.

In accordance with the present invention, the satisfying of load pulsations and energy source interruption pulses and the accommodation of energy source waveform variations is preferably achieved through the use of power supply filtering elements in the satellite vehicle 100 which are of improved lightweight high energy density capability. These filtering elements are preferably arranged in the form of a secondary or rechargeable electrochemical battery of the type described in the above referenced U.S. Air Force patent application, docket number AF 16775, PTO Ser. No. 06/792,099, which is hereby incorporated by reference herein. Other battery arrangements, especially arrangements providing for the short and direct current flow paths incidental to low electrical impedance, and long battery operating life, along with small physical size and weight could of course, be employed in the FIG. 1 satellite vehicle. Conversely, other settings outside of the space environment can also benefit from the presently disclosed invention.

Figure 2:
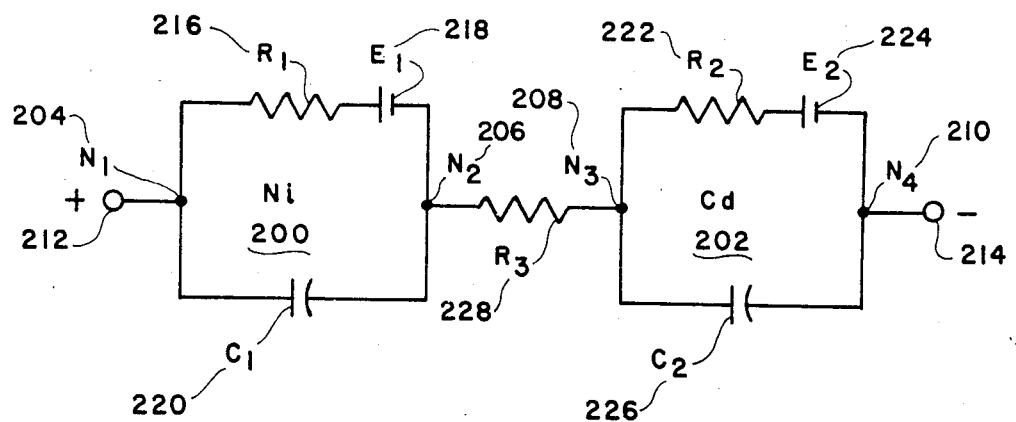
FIG. 2 is an electrical element representation of a battery filter element made in accordance with the invention.

A secondary cell battery such as the nickel-cadmium alkaline cell battery, when connected to a pulsed source of electrical energy or a pulsating load current device, displays electrical characteristics which differ sharply from those of the usual electrolytic capacitor filter element, characteristics which can be represented by the electrical elements shown in FIG. 2 of the drawings. The FIG. 2 electrical elements include two series connected, parallel path networks 200 and 202 including the four electrical nodes 204, 206, 208, and 210 also labeled N1, N2, N3, and N4. The nodes 204 and 210 are connected with the battery positive and negative terminals 212 and 214 respectively, so that the node 204 and the terminal 212 have the same electrical potential and the node 210 and terminal 214 have the same electrical potential. Other electrical elements in the FIG. 2 representation include a pair of voltage sources 218 and 224 representing the voltage developed between the positive electrode and the battery electrolyte and the voltage developed between the electrolyte and the negative electrode i.e., the nickel and cadimum electrodes, respectively, in the case of the aforementioned nickel-cadmium batery cell. The electrical resistances R1 and R2, 216 and 222 respectively in FIG. 2, represent the ionic and activation resistances present at the nickel and cadmium electrodes of the representative nickel-cadmium battery respectively. The capacitors C1 and C2, 220 and 226 respectively in FIG. 2, incorporate electrode double layer capacitances into the FIG. 2 battery representation. The resistance R3, 228 in FIG. 2, corresponds to the ohmic resistance through the electrolyte and electrode conductors of the battery cell. The FIG. 2 electrical representation corresponds to one cell of a multiple celled battery which is preferably used in the FIG. 1 apparatus, additional battery cells are representable by additional networks of the FIG. 2 type or alternately by modification of the numeric values assigned to the FIG. 2 elements.

Additional details concerning the FIG. 2 battery and other information relating to the present invention are included in a technical report titled "Pseudo Bipolar Nickel-Cadmium Batteries Used as Filter Elements to Pulsed Current Loads" authored by Michael B. Cimino and Gregory M. Gearing, of the Energy Conversion Branch, Aerospace Power Division of the Aero Propulsion Laboratory, Air Force Weight Aeronautical Laboratories, Air Force Systems Command, Wright-Patterson ABF OH, 45433. The Cimino and Gearing report is identified as AFWAL-TR-84-2094 and also as a thesis submitted in partial fulfillment of the requirements for the Master of Science Degree at the Air Force Institute of Technology, Weight-Patterson AFB OH, 45433. Copies of this technical report may be obtained from the National Technical Information Service, from the Air Force Weight Aeronautical Laboratories (AFWAL/POOC), and in thesis form from the Air Force Institute of Technology. The contents of this technical report and thesis are hereby incorporated by reference into the present specification.

The electrical characteristics of the FIG. 2 battery cell when impressed with a direct current energy source and a pulsed load current, differ sharply from the characteristics of the conventional electrolytic filter capacitor. One of the principal differences between the FIG. 2 apparatus and the conventional capacitor concerns the constant voltage nature of the FIG. 2 apparatus as represented by the voltage sources 218 and 224, this constant voltage nature differs from the capacitor charactreistic wherein removal of energy from storage in the capacitor is accomplished by a directly related change in capacitor voltage—in accord with the equation: energy $(E) = \frac{1}{2}$ capacitance $(C)$ x voltage $(V)^2$. In contrast with this direct relationship between stored energy or charge and voltage in a capacitor, the electron and ion exchange in the FIG. 2 battery cell i.e., the faradaic mechanism in the sources 218 and 224 occurs under constant voltage conditions—at least with respect to first blush or gross effects.

The presence of the capacitors 220 and 226 in the FIG. 2 battery cell introduces a smaller magnitude transient relationship between battery voltage and energy content—a relationship in the nature of that found in the conventional electrolytic capacitor. When a nickel-cadmium battery for example, is charged, the electrolyte forms layers of charged ions near each battery electrode and each layer of charged ions is separated by water molecules which act as a capacitor dielectric medium between charge layers. These layers of charge are named the electrical double layers and ion interaction occurs predominatly in the two of these layers closest to the electrode structure.

The double-layer charge is influential in determining the initial rate of change of voltage and current when a battery is switched between the charging, standby, and discharging states and is particularly significant for batteries exposed to transient or pulsed or pulsating current conditions. A discussion of the double layer capacitance is to be found in the article "Absorption of Hydrogen and Oxygen on Electrode Surfaces" by R. F. Amile, published in the Journal of the Electrochemical Society, vol 108, p. 377, 1961 which is hereby incorporated by reference herein. Typically, double layer capacitance values range from 50 to 2200 microfarads for each square centimeter of electrode area, the higher values in this range being associated with a nickel electrode and the lower values with a cadmium electrode in a nickel-cadmium battery cell, for example.

The double-layer capacitances and faradaic mechanisms represented by the capacitors 220 and 226 and voltage sources or ideal batteries 218 and 224 respectively in FIG. 2, therefore all have different time responses or time constants during transient charging and discharging of the FIG. 2 battery apparatus. Generally the double-layer capacitances result in time constants measured in milliseconds of time, while the faradaic decay as represented by the voltage sources identifies with time constants of longer duration, times measured in minutes to hours in the presently contemplated battery arrangement. The lower value of capacitance associated with a negative or cadmium electrode provides the initial or more rapid change in battery voltage upon impression of a transient load, and this initial rapid change of battery voltage is followed by the change resulting from discharge of the larger valued nickel double layer capacitance. The two capacitor related changes are in turn followed by the conventional faradaic discharge or change of voltage supplied by the sources 218 and 224 in FIG. 2.

Battery life as measured in terms of number of charge and discharge cycles achievable before unacceptable electrical storage capacity erosion occurs in a significant consideration when a battery of the FIG. 2 type is employed in a FIG. 1 satellite vehicle or other pulsed current electrical filtering environment. In reality, battery cycle life, battery depth of discharge (DOD) and battery energy storage efficiency, that is, stored joules per pound of battery weight are a trio of interrelated factors which require combined little consideration with respect to demanding battery usage such as is contemplated herein.

Much usage of secondary battery cells, especially of the nickel-cadmium battery, has involved cycles having deep battery discharge followed by a slower recharge. Such usages as vehicle starting and standby electrical energy sourcing and even many satellite applications come within a cycle of this type. These usages may be considered to involve DOD's between roughly 15% and 80% of capacity followed by recharging at current values between one-tenth and 1.0 times the current which will completely discharge a charged battery in a time of one hour, the "C" rate current. Frequently batteries exposed to such cycles provide lifetimes of between 500 and 50,000 (5E4) cycles before the battery energy storage capacity is decreased to one-half its initial rated capacity. At a lower DOD a given battery will survive a greater number of charge and discharge cycles than at higher DOD levels—a result of internal heating and other destructive events in the charge and discharge sequence.

A battery used as a filter element in a spacecraft power system as represented in FIG. 1 clearly is required to endure more than this 5E4 charge and discharge cycles in order to be practical since even at a five cycle per second use rate, such a life represents only about three hours of battery life. Cycle lifetimes in the order of 1E9 or more are desirable for a FIG. 1 used battery filter element.

Battery life and depth of discharge in a FIG. 1 type utilization also influence battery energy density considerations, as is implied by the trio of factors concept recited above. For example, if a common 1.2 volt, 22 ampere-hour nickel-cadmium cell is operated at a DOD of 0.01% and a 5 Hz charge and discharge rate, it delivers approximately 10 joules of energy per discharge cycle. Such a cell might weigh 10 pounds and therefore provide an energy density in the order of 1 joule per pound. If, however, the cell is capable of operating at the ten times greater DOD of 0.1%, the same battery would be delivering 100 joules of energy and operating at an energy density of 10 joules per pound. The battery filter element of the above incorporated by reference copending patent application, for example, includes provisions for this type of usage and has been found capable of 1E7 operating cycles using a DOD of 0.013% and a 5 Hz cycle charge/discharge rate. This battery filter element is also capable of energy density values in the range of 40 joules per pound of weight.

Figure 3:
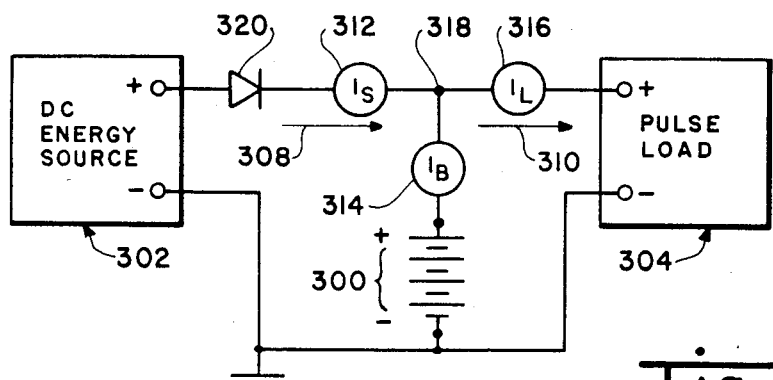
FIG. 3 is an electrical circuit usable with a battery filter element made in accordance with the invention.

FIG. 3 of the drawings shows a representative circuit in which a battery of the FIG. 2 type is operated in the manner required for a FIG. 1 used battery filter element. In FIG. 3 a battery filter element 300 is shown connected in electrical shunt with a direct current energy source 302 and a pulsating current load 304. The pulsating current load 304 may include switching transistors and dissipative elements or other apparatus known in the electronic art. Current flows in the energy source 302, the battery filter element 300, and the load 304 are measured by the current sensing elements 312, 314, and 316. Current flow from the energy source 302 is indicated by the arrow 308 in FIG. 3, while current flow to the pulsating current load is indicated by the arrow 310. The current summation node between the energy source, battery filter element, and load is indicated at 318 in FIG. 3, and a reverse current blocking diode which prevents battery discharge current from flowing through the energy source 302, is indicated at 320.

The FIG. 3 circuit is representative of both a test circuit usable for evaluating battery filter element performance and also generally of the circuit arrangement used for a battery filter element in the FIG. 1 apparatus. A practical embodiment of the FIG. 3 circuit in a FIG. 1 type satellite vehicle might omit the current sensing elements 312-316 in the interest of weight, cost and other practical considerations or alternately, might replace these elements with devices generating signals usable for telemetry or other electronic functions. Notable characteristics of the energy source 302 may include:

Limited peak current capability;
Interruptable energy supply capability, e.g., radiant energy source interruption by an object in different orbit;
Greater output voltage than the faradaic voltage of battery filter element 300;
Average current capability equal to or greater than the average current requirement of the load 304; and
Alternately, of lower current capability than the peak currents of the load 304.

The solar excited electrical energy source indicated for the satellite vehicle 100 in FIG. 1 is one example of an energy source within these characteristics; certain types of fuel cells, nuclear electrical energy sources, and even certain types of battery sources also come within these characteristics. Generally, the presence of an electrical source having lower peak current capability than the requirements of a pulsating current load device provides a suitable setting for a battery filter element in accordance with the present invention.

The electronic load 304 in FIG. 3 may comprise a laser device, a radar or radio frequency transmitter, a computer or other apparatus involving electronic energy flow control devices and capable of generating pulsating load current requirements. The pulse generator 306 may be considered in a practical embodiment of the FIG. 3 apparatus to be incorporated within the load 304 or may in a test setup, be a separate and distinct piece of signal generating equipment as indicated in FIG. 3.

The battery filter element 300 in FIG. 3 is desirably of a low internal impedance, that is, of low internal resistance and small internal inductance with respect to the effective impedance of the electronic load 304 and also preferably of low impedance with respect to the internal impedance of the energy source 302. A pseudo-bipolar battery filter element of the type described in the above incorporated by reference copening U.S. patent application provides characteristics reasonably meeting these low impedance requirements. Other battery arrangements preferably involving central rather than peripheral cell interconnection attachment could also be employed.

The interrelated concepts of battery discharge/recharge cycle life and stored energy density relating to the battery filter element 300 are described above in connection with FIG. 2. Generally for the FIG. 3 battery filter element, operation involving depth of discharge between 0.01% to 0.1% and a charge/discharge cycle life of over ten million cycles is contemplated. Improved operating principles and construction for a battery filter element will, of course, enable greater battery cycle life.

Figure 4:
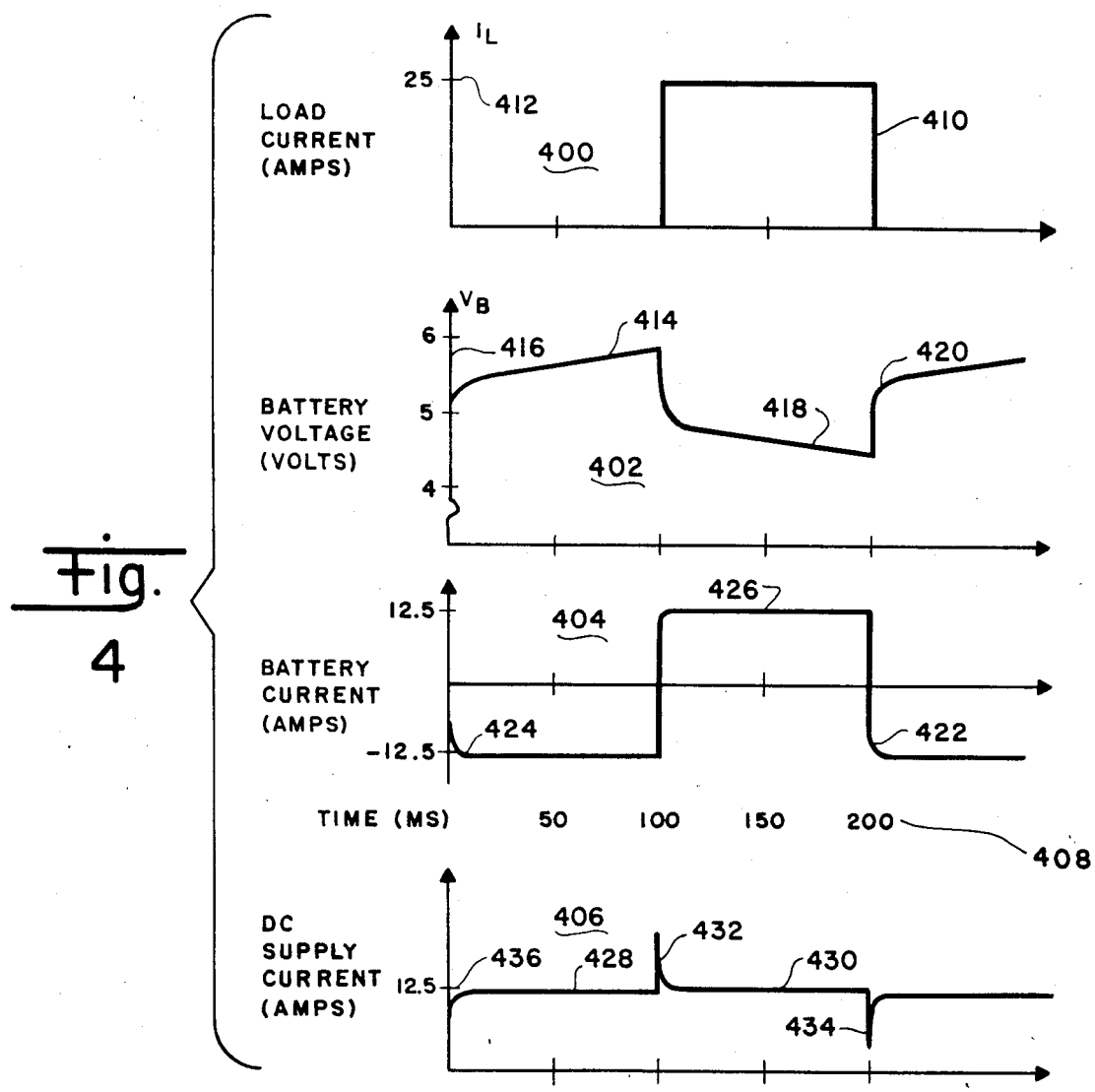
FIG. 4 is a group of electrical waveforms describing operation of the FIG. 3 circuit.

The current supplied to the load, the current 310 in FIG. 3, originates in some combination of current from the battery filter element 300 and current 308 from the energy source 302 and divides between these sources, depending on the relative source impedances involved; this division can vary nearly instantaneously with load current pulsations or pulses from the energy source 302, as is indicated in greater detail in FIG. 4 of the drawings.

In FIG. 4, current and voltage waveforms appropriate to the battery filter element of the above incorporated by reference patent application and corresponding to the FIG. 3 current identifications are shown. The waveform at 400 in FIG. 4 represents load current, and corresponds to the current $I_L$ at 316 in FIG. 3. This current is shown in the FIG. 4 example to comprise a pulse 410 of 25 amperes amplitude and 100 milliseconds time duration. Time durations for each of the waveforms in FIG. 4 are indicated along the scale 408, while amplitudes are indicated along the vertical scale adjacent each waveform as at 412 for the 25 ampere load current. The voltage applied to the load 304 in FIG. 3 is indicated in the waveform 402 of FIG. 4 and is shown to have values varying between 4.5 and 5.75 volts in different time portions of the waveform 402. Voltage amplitudes are indicated along the scale 416 which is made discontinuous or exaggerated in nature in order to emphasize the variations occurring.

The battery filter element 300 in FIG. 3 is subjected to currents according to the waveform 404 in FIG. 4. These currents include a charging current of 12.5 amperes as indicated at 424 during load removed portions of the operating cycle and a discharging current of 12.5 amperes as indicated at 426 during the load current pulse conducting time. Current flow in the energy source 302 in FIG. 3 is indicated at 406 in FIG. 4, is shown at 428 and 430 to vary about the 12.5 ampere nominal value indicated at 436, and to also include the current transients 432 and 434 at the time of load current commencing and ending.

Several of the notable features in the FIG. 4 waveforms can be related to electrical elements shown in the FIG. 2 battery filter element. The slow rise and fall of battery filter element voltage indicated at 414 and 418 respectively and the rounded voltage waveform corner 420, relate to the charging and discharging of capacitors 220 and 226 in FIG. 2. A similar rounding occurs at 422 in the battery current waveform 404. The resistances 216, 222, and 228 in FIG. 2 contribute to the slight average offsets in the battery filter element current flow in the waveform 406.

The effectiveness of a battery filter element in replacing the conventional electrolytic capacitor in a power supply including consideration of equivalent capacitances and energy storage quantitative amounts are discussed in the above incorporated by reference copending patent application. Generally for battery filter element embodiments described therein which have circular plates or electrodes of 3.3 inch diameter, centers located cell-to-cell interconnecting members, close electrode spacing and potassium hydroxide electrolyte of 32% by weight KOH concentration, characteristics of the following electrical nature obtain.

These electrical characteristics can be more precisely described in terms of multiples of the above defined "C" rate where "C" is again the value of current that will totally discharge a fully charged battery in the time of one hour.

Battery filter elements made in accordance with the described embodiment are useful in the presence of charging and discharging pulse currents up to the 25 to 35 ampere range, currents which are in excess of 18 times the C rate of the battery in the charging and loading circuit arrangement described above. The principal limitation at this rate of performance is actually electrolyte heating—to a point approaching boiling. Better electrolyte heat dissipation than is provided by the acrylic plastic cavity receptacle structure could, of course, be arranged to extend this capacity.

Operation with currents in this 25 to 35 ampere range with a four cell battery filter element and depth of discharge (DOD) values in the range of 0.05 to 0.07 also provides energy storage densities in the range of 40 joules per pound, a value some forty times greater than is achieved with electrolytic capacitors. The effective energy density increases almost linearly with DOD for values in the 0.01 to 0.08 range.

Terminal voltage for the battery filter element can be reasonably expressed over the time interval t, by the equation:

$$V(t) + E_0 - 4iR_3 - 4iR_2[1 - \exp(-t/R_2C_2)]$$

In this equation the presence of four series connected cells is presumed and the resistances and capacitances for the nickel electrodes are neglected in view of their small magnitude with respect to cadmium electrode parameters. Symbols are defined below.

The electrical characteristics of the described embodiment battery filter element also include effective initial cell capacitance in the range of 11 farads in each of the four cells of the described battery filter element; actually double layer capacitance values of 5000 farads and 11 farads in a particular cell are to be expected, according to calculations. Since the two double layer capacitances are electrically series connected an effective capacitance, $C_2$ in the above equation, that is near the lower value of 11 farads is achieved.

Internal resistance values in the range of 20 to 60 milliohms for the electrolyte and electrode conductor resistances, $R_3$ in the above equation, and in the range of 50 to 60 milliohms for the double layer capacitance shunted resistances, $R_2$ in the above equation, are also to be expected from the described embodiment battery filter element. These values are for a four-cell arrangement.

At a 5C discharge rate the Faradaic component of voltage change at the terminals of the four-cell example, that is the change of voltage in the ideal battery shown in the circuit of FIG. 2 is found to be small and on the order of 0.14 millivolt. The limited magnitude of this change component allows its neglect in most considerations of the battery filter element.

By way of the low resistances, large capacitance, relatively fixed voltage, and large current handling capabilities attributable to the described battery filter element, it can be observed that desirable pulse current filtering in power supply and other electrical network locations are feasible with this component. These desirable electrical properties are, of course, in addition to the considerable weight and energy storage density improvements enabled by the described apparatus. Other characteristics of the described embodiment battery filter element including graphs and test results information are contained in either the academic thesis or the technical report identified above and incorporated herein by reference.

Modification of the described embodiment apparatus are possible to achieve even more desirable properties. The use of improved electrolyte cooling has been described above and other improvements such as in the composition and construction of electrodes and the composition and construction of cell cavity receptacles and battery filter element enclosure structures are also possible. The described embodiment has emphasized the attainment of low electrical impedances and the attainmente of these low impedances in a favorable weight and volume environment; it is of course possible to emphasize the attainment of greater energy storage capability in the battery filter element as would be desirable where the load and energy sources involved call for a standby energy reserve in the battery filter element in addition to the waveform correction heretofore emphasized. Day and night space vehicle exposure, for example, would call for modifications of this nature.

The battery filter element of the present invention therefore provides a desirable arrangement for obtaining large magnitude pulses of direct current energy in a space limited and weight limited environment as is commonly found in satellite vehicles and other present-day equipment employing electronic systems. The desirable electrical properties, reasonably long life, and moderate cost of the battery filter arrangement are also conducive to the use of such arrangements in applications which have heretofore been limited to capacitor, inductor, and other power filtering arrangements. The relatively modest energy loss characteristics of a battery filter element are also attractive for use in space satellite and other limited energy source environments.

While the apparatus and method herein described constitute a preferred embodiment of the invention, it is to be understood that the invention is not limited to this precise form of apparatus or method, and that changes may be made therein without departing from the scope of the invention, which is defined in the appended claims.

We claim:

1. Satellite vehicle electrical energy apparatus having accommodating capability for pulsating load current, solar eclipse and solar optical misalignment transients and comprising the combination of:
   a satellite space vehicle receivable in a solar energy source exposed travel orbit;
   a solar cell array source of current-limited, eclipse interruptable and solar optical misalignment transient susceptible electrical energy, said source of energy including a plurality of solar cell energy transducer elements dispersed over an area contiguous of said vehicle in optically alignable and misalignable orientation with said solar energy source;
   a radiant energy emitting electronic switched electrical load member connected to the output of said solar cell array source of electrical energy, said load member including radiant signal determined pulsating current energy requirements in excess of the current delivering capability of said solar cell array source of energy; and
   nickel-cadmium battery filter element means electrically connected in shunt with said solar cell array source of electrical energy and said pulsating current load,
   said battery filter element means being of a three segregated time constant, two capacitor, three resistance transient energy receiving and supplying character,
   said battery filter element means including a plurality of radially disposed battery electrode elements and a plurality of axially oriented electrode interconnecting conductors centrally located of said electrode elements,
   said battery filter element means having electrical energy storing capacity between one thousand and ten thousand times the energy content of one of said load current pulsations,
   whereby said battery filter element means supplies electrical energy to said load member during randomly staggered and also during combined occurrences of said load current pulsations, said solar optical misalignment transients and said solar eclipse transients.

2. Direct current electrical energy transfer apparatus comprising:
   a source of direct current electrical energy of first current capability and first, open circuit, voltage capability;
   pulsating electrical load apparatus energizable at a second, lower magnitude, voltage and having instantaneous peak current requirements in excess of said first current capability with time average current requirements less than said first current capability; and
   low electrical impedance battery means shunt connected with said energy source and said load apparatus for temporarily storing the difference electrical energy between said first and second current level energies at said second voltage fixed amplitude, said battery means including a plurality of axially aligned radially extending battery cells aligned along a central axis and each having radially disposed cell electrodes extending outward from said central axis, radially disposed electrode current flow, axially disposed cell interconnector elements extending along said axis intermediate said cells, and axially disposed interconnector element and cell electrolyte current flow orientations.

3. The apparatus of claim 2 wherein said source of direct current electrical energy comprises a solar cell radiant energy to electrical energy transducer.

4. The apparatus of claim 3 wherein said pulse modulated electrical load comprises a pulsed energy emitting system.

5. The apparatus of claim 4 wherein said energy emitting apparatus is an electronic system.

6. The apparatus of claim 4 wherein said energy emitting apparatus comprises a laser optical system.

7. The apparatus of claim 5 wherein said energy emitting apparatus comprises a radar transmitting and receiving apparatus.

8. The apparatus of claim 2 wherein said battery means is of an electrical size capable of energizing said load apparatus for a time interval of less than ten minutes duration.

9. The apparatus of claim 8 wherein said battery means includes a plurality of nickel cadmium battery cells.

10. Electrical filter battery circuit apparatus comprising the combination of:
    first and second electrical nodes (204, 206);
    a first electrical resistance element (216) connected at a first terminal thereof to said first electrical node;
    a first electrical voltage source (218) of low internal impedance connected at the positive terminal thereof to a second terminal of said first electrical resistance element and at the negative terminal thereof to said second electrical node;
    a first electrical capacitance element (220) electrically coupled between said first and second electrical nodes;
    third and fourth electrical nodes (208, 210);
    a second electrical resistance element (222) connected at a first terminal thereof to said third electrical node;
    a second electrical voltage source (224) of low internal impedance connected at the positive terminal thereof to a second terminal of said second electrical resistance element and at the negative terminal thereof to said fourth electrical node;
    a second electrical capacitance element (226) electrically coupled between said third and fourth electrical nodes;
    a third electrical resistance element (228) connected between said second and third electrical nodes;
    pulsating current electrical load apparatus (304) connected between said first and fourth electrical nodes; and
    direct current electrical energy supply means (302) having internal impedance greater than the sum of said first, second and third electrical resistance elements and connected to said first and fourth electrical nodes for supplying electrical energy to said nodes and apparatus connected thereto;

whereby said first and fourth electrical nodes comprise positive and negative terminals of a Faradaic and capacitive operating mode energy storage electrical filter battery of waveform smoothing and interrupted energy supply means capability.

11. The apparatus of claim 10 wherein said first and second electrical resistance elements are comprised of first and second electrode to electrolyte interfaces and located at electrodes of said electrical filter battery.

12. The apparatus of claim 11 wherein said first and second electrical capacitance elements are comprised of double layer capacitances in said electrical filter battery.

13. The apparatus of claim 12 wherein said third electrical resistance element is comprised of electrolyte and electrical interconnection element resistances in said electrical filter battery.

14. The apparatus of claim 11 wherein said electrode to electrolyte interface resistances are each comprised of ionic and activation resistance components.

15. The apparatus of claim 11 wherein said electrode members are comprised one of nickel and one of cadmium active materials.

16. The apparatus of claim 15 wherein said second electrical capacitance element is located at said cadmium active material electrode and is of substantially smaller electrical size than a first electrical capacitance element located at said nickel active material electrode.

17. The apparatus of claim 16 wherein said second electrical capacitance has an electrical value between one tenth and ten farads in a battery cell of electrode volume of between three and four cubic centimeters for each electrode.

18. The apparatus of claim 13 wherein said first, second and third electrical resistance elements each have an electrical value less than one hundred milliohms in a battery cell of less than four cubic centimeters of electrode volume for each said first and second voltage source elements.

19. The apparatus of claim 11 wherein said electrical filter battery is capable of energizing said electrical load apparatus for a period of between five and thirty minutes following termination of energy supply from said electrical energy supply means.

20. Energy utilizing apparatus comprising:
a source of current limited direct current electrical energy;
an electrical load of pulsating current requirements connected with said energy source; and
rechargeable electrochemical battery means of low internal impedance with respect to said energy source and connected in electrical shunt with said pulsating current load for collecting energy from said source and delivering energy to said load, said collecting and delivering being at a fixed predetermined battery means terminal voltage and in pulsations having energy content less than one one-hundredth of the total energy capacity of said battery means;
said battery means including a battery having planar electrodes disposed in a plurality of cells and cell-to-cell interconnecting conductors connected to a central portion of said planar electrodes.

* * * * *

UNITED STATES PATENT AND TRADEMARK OFFICE
CERTIFICATE OF CORRECTION

PATENT NO. : 4,700,122

DATED : October 13, 1987

INVENTOR(S) : Michael B. Cimino et al

It is certified that error appears in the above-identified patent and that said Letters Patent is hereby corrected as shown below:

Col 1, line 11, "relates" should be --related--.

Col 1, line 13, "relates" should be --related--.

Col 1, line 29, "frequency" should be --frequently--.

Col 4, line 4-5, "tot he" should be --to the--.

Col 5, line 21, "Weight" should be --Wright--.

Col 5, line 23, "ABF" should be --AFB--.

Col 5, line 27, "Weight" should --Wright--.

Col 5, line 30, "Weight" should be --Wright--.

Col 8, line 28, "copening" should be --copending--.

Col 9, line 66, "+" should be --=--.

Signed and Sealed this

Nineteenth Day of July, 1988

Attest:

DONALD J. QUIGG

Attesting Officer     Commissioner of Patents and Trademarks